United States Patent [19]
Ershov

[11] Patent Number: 5,970,082
[45] Date of Patent: Oct. 19, 1999

[54] VERY NARROW BAND LASER

[75] Inventor: Alexander I. Ershov, San Diego, Calif.

[73] Assignee: Cymer, Inc., San Diego, Calif.

[21] Appl. No.: 08/886,715

[22] Filed: Jul. 1, 1997

Related U.S. Application Data

[63] Continuation-in-part of application No. 08/869,239, Jun. 4, 1997, Pat. No. 5,856,991.

[51] Int. Cl.⁶ ........................................................ H01S 3/08
[52] U.S. Cl. ............................ 372/102; 372/99; 372/100; 372/95; 372/20; 372/57
[58] Field of Search ................................. 372/20, 57, 60, 372/95, 98, 99, 100, 101, 102

[56] References Cited

U.S. PATENT DOCUMENTS

| | | | |
|---|---|---|---|
| 4,360,925 | 11/1982 | Brosnan et al. ........................ | 372/95 |
| 4,803,696 | 2/1989 | Pepper et al. .......................... | 372/95 |
| 5,012,483 | 4/1991 | Reintjes et al. ........................ | 372/95 |
| 5,043,998 | 8/1991 | Cooper et al. .......................... | 372/95 |
| 5,095,492 | 3/1992 | Sandstrom ............................. | 372/102 |
| 5,150,370 | 9/1992 | Furuya et al. ...................... | 372/102 X |
| 5,216,680 | 6/1993 | Magnusson et al. .................. | 372/102 |
| 5,327,449 | 7/1994 | Du et al. ................................. | 372/95 |
| 5,559,816 | 9/1996 | Basting et al. ..................... | 372/102 X |
| 5,596,596 | 1/1997 | Wakabayashi et al. ................ | 372/102 |

OTHER PUBLICATIONS

Duarte and Piper, "Comparison of prism–expander and grazing–incidence grating cavities for coppe laser pumped dye lasers," *Applied Optics*, vol., 21, No. 15 (Aug. 1, 1982) 2782–2786.

Giuri et al., "Output coupler design of unstable cavities for excimer lasers," *Applied Optics*, vol. 36, No. 6 (Feb. 20, 1997) 1143–1148.

Magni et al., "Resonators with Variable Reflectivity Mirrors," in *The Pysics and Technology Laser Resonators*, (Bristol and New York: Hilger 1989), 94–105.

Shaw, "Excimer Laser Resonators," in *The Physics and Technology of Laser Resonators*, (Briston and New York: Hilger 1989), 237–245.

Reintjes, "Coherent Ultraviolet and Vacuum Ultraviolet Sources," in *Laser Handbook*, vol. Edited by Bass and Stitch (North–Holland:Elsevier, 1985) 44–50.

*Primary Examiner*—Hemang Sanghavi
*Attorney, Agent, or Firm*—John R. Ross, Esq.

[57] ABSTRACT

A very narrow band laser. The very narrow bandwidth is achieved by creating an unstable resonance cavity using a cylindrical, partially-reflecting mirror to provide an output coupler in combination with a line narrowing module having a beam expander and a curved grating.

17 Claims, 10 Drawing Sheets

VERY NARROW BAND LASER

This application is a Continuation-in-Part of U.S. Ser. No. 08/869,239, entitled Very Narrow Band Laser, filed Jun. 4, 1997, now U.S. Pat. No. 5,856,991. This invention relates to narrow band lasers and in particular to narrow band KrF lasers.

BACKGROUND OF THE INVENTION

TECHNIQUES FOR LINE NARROWING

Techniques for decreasing the bandwidth of the output of lasers are well known. Several such techniques used on excimer lasers are discussed by John F. Reintjes at pages 44–50 in *Laser Handbook*, Vol. 5, North-Holland Physics Publishing, Elsevier Science Publishers B.V. These techniques include the utilization of gratings, including echelle gratings for wavelength selection. All frequency selective elements, including gratings, depend on angular dispersion for their selectivity. Therefore, the spectral revolution of these frequency selective systems is improved by reducing the beam divergence. Divergence can be reduced with the use of small apertures. One well known technique is to reduce the divergence of the beam by magnifying it with a beam expander, such as a telescope upstream of the frequency selection element. Beam expansion reduces the divergence angle by the magnification factor of the beam expander. Prisms inserted between the gain medium and the frequency selecting element have been used to magnify the beam in a single direction. Unstable resonators are well known, and it is known that unstable resonators may be configured to provide reduced beam divergence.

BENDING GRATINGS

Bending gratings to compensate for curved wavefronts are known. U.S. Pat. No. 5,095,492 assigned to the assignee of the present invention describes such a grating which has been used in laser resonators having flat output couplers to correct for distortions caused by optical components in the light path. U.S. Pat. No. 5,095,492 is incorporated herein by reference.

EXCIMER LASERS

KrF excimer lasers are currently becoming the workhorse light source for the integrated circuit lithography industry. A typical prior art KrF excimer laser is depicted in FIG. 1 and FIG. 2. A pulse power module 2 provides electrical pulses lasting about 100 ns to electrodes 6 located in a discharge chamber 8. The electrodes are about 28 inches long and are spaced apart about ⅗ inch. Typical lithography lasers operate at a high pulse rate of about 1,000 Hz. For this reason it is necessary to circulate a laser gas (a typical example being about 0.1 percent fluorine, 1.3 percent krypton and the rest neon which functions as a buffer gas) through the space between the electrodes. This is done with tangential blower 10 located in the laser discharge chamber. The laser gasses are cooled with a heat exchanger also located in the chamber. Commercial excimer laser systems are typically comprised of several modules which may be replaced quickly without disturbing the rest of the system. Principal modules are shown in FIG. 1 and include:

Laser Chamber 8,
Pulse Power Module 2,
Output coupler 16,
Line Narrowing Module 18,
Wavemeter 20,
Computer Control Unit 22, and
Peripheral Support Sub systems.

The discharge chamber is operated at a pressure of about three atmospheres. These prior art lasers typically operate in a pulse mode at about 600 Hz to about 1,000 Hz, the energy per pulse being about 10 mJ and the duration of the laser pulses is about 15 ns. Thus, the average power of the laser beam is about 6 to 10 Watts and the average power of the pulses is in the range of about 700 KW.

At wavelengths below 300 nm there is no available technique for providing refractive systems with chromatic correction. Therefore, stepper lenses will have no chromatic correction capability. The KrF excimer laser operates at a nominal wavelength of about 248 nm and has a natural bandwidth of approximately 300 pm (full width half maximum, or FWHM). For a refractive system (with a numerical aperture >0.5)—either a stepper or a scanner—the wavelength of the light source needs to be held substantially constant with variations and spread minimized to the picometer range. Current prior art commercially available laser systems can provide KrF laser beams at a nominal wavelength of about 248 nm with a bandwidth of about 0.8 pm (0.0008 nm). Wavelength stability on the best commercial lasers is about 0.25 pm. With these parameters stepper makers can provide stepper equipment for manufacture of integrated circuits with resolutions of about 0.3 microns.

To improve resolution a more narrow bandwidth is required. For example, a reduction of a bandwidth to below 0.6 pm (FWHM) would permit improvement of the resolution to below 0.25 microns. As indicated above, the bandwidth is usually specified as the pulse width measured (on a chart of pulse power versus wavelength) as the full width at one half the maximum power of the pulse. Another important measure of the pulse quality is referred to as the "95% integral." This is the spectral width of the portion of the pulse containing 95% of the pulse energy. The desired 95% bandwidth is less than about 1.5 pm to 2.0 pm. However, the prior art KrF laser can only provide "95% integral" values of 3 pm over the lifetime of the laser.

INDUSTRY NEED

The performance of stepper equipment depends critically on maintaining minimum bandwidth of the laser throughout the operational lifetime of the equipment. Therefore, a need exists for a reliable, production quality excimer laser system, capable of long-term factory operation and having improved wavelength stability and reduced bandwidth.

SUMMARY OF THE INVENTION

The present invention provides a very narrow bandwidth laser. The very narrow bandwidth is achieved by creating an unstable resonance cavity using a cylindrical, partially-reflecting mirror to provide an output coupler in combination with a line narrowing system comprising a beam expander and a grating slightly curved to correct the wavefront distortion provided by the cylindrical mirror. In a preferred embodiment, prisms are used to expand the beam.

DETAILED DESCRIPTION OF PREFERRED EMBODIMENTS

Preferred embodiments of the present invention may be described by reference to the drawings.

BASIC PRINCIPLE

Figure 12:
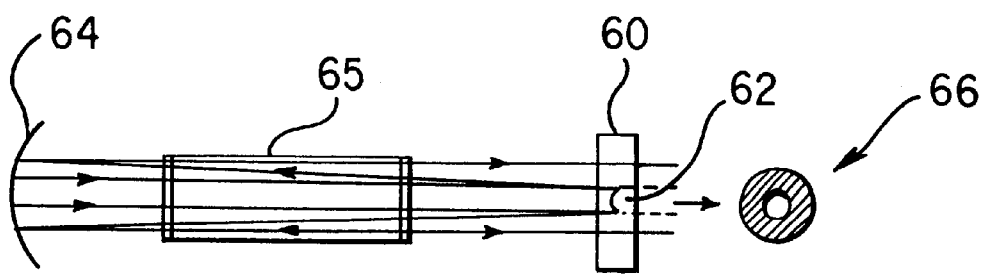
FIG. 12 is a sketch of a prior art unstable resonance cavity.

A typical prior art unstable resonance cavity is demonstrated in FIG. 12. In this example, the resonance cavity is formed by an output coupler assembly 60 comprising a convex mirror 62 (which could be total reflecting or partially reflecting) and a large diameter, total reflecting, concave mirror 64. A cross section of the output beam (assuming a totally reflecting mirror at the center of the output coupler) from gain medium 65 is shown at 66.

Figure 13:
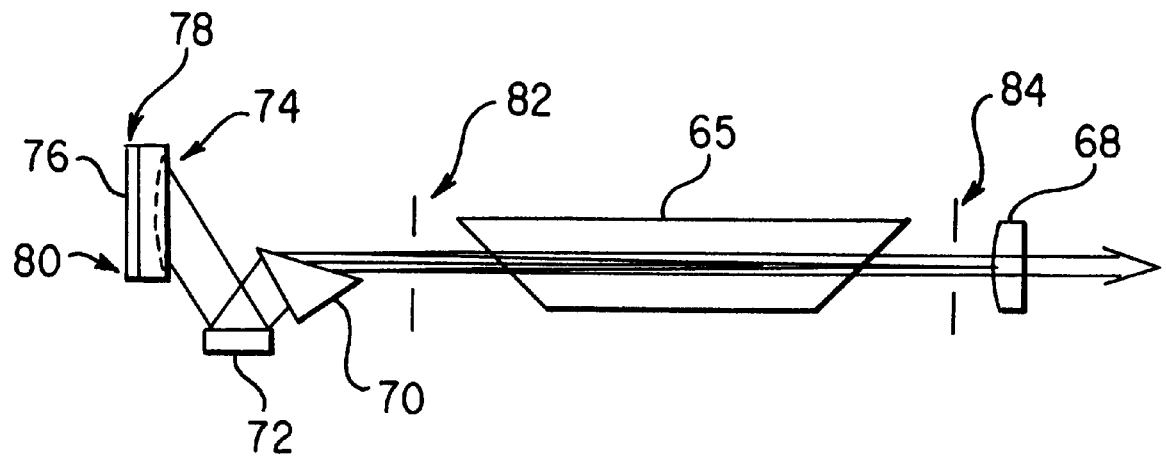
FIG. 13 is a sketch showing the principal elements of the present invention.

An example of the present invention is demonstrated in FIG. 13. Output coupler comprises a 20% partially reflecting convex cylindrical mirror 68. The output of the gain medium 65 is line narrowed in a line narrowing module comprising a prism beam expander 70 which expands the beam in a single direction perpendicular to the axis of the cylindrical mirror 68, a pivoting, totally reflecting mirror 72 and a grating 74 having a curvature which is adjustable and is adjusted to correct for the wavefront distortion provided by cylindrical mirror 68. In a preferred embodiment, the curvature of grating 74 is produced by a compressed spring and threaded micrometer push rod 76 applying compression force against the inside of legs 78 and 80 extending from two ends of grating 74. Apertures 82 and 84 restrict the cross sectional dimension of the beam.

Another embodiment of this invention would utilize a partially reflecting concave cylindrical mirror as the output coupler and a grating which is slightly bent to provide a convex reflecting surface.

VERY NARROW-BAND KRF LASER

A very narrow-band KrF laser utilizing the features of the present invention is described below:

The Chamber

Figure 3:
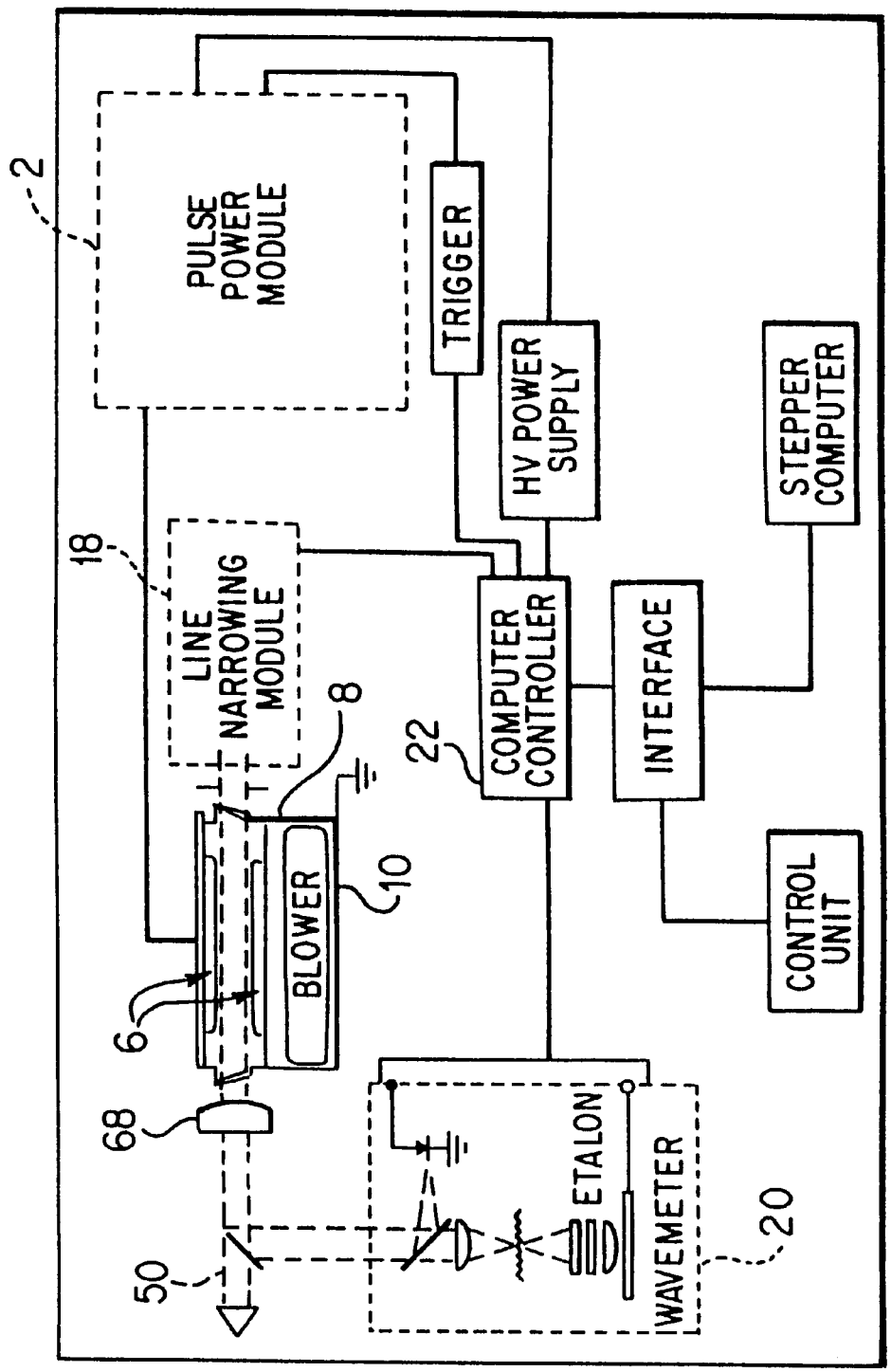
FIG. 3 is a block diagram showing an excimer laser utilizing the present invention.

The discharge chamber 8 of a preferred embodiment of the present invention, shown in FIG. 3, is the same as prior art discharge chambers. The chamber 8 is a vessel, designed to hold several atmospheres of corrosive gases. A discharge region is defined by the two electrodes 6 separated by a gap of 1.2 to 2.5 cm. The cathode is supported by an insulating structure since it is connected to the high voltage, while the anode is attached to the metal chamber which is at ground potential. Preionization is done by corona discharge preionizers located on either side of the discharge region. Due to the corrosive nature of the laser gas, the chambers use particular metals chosen to resist fluorine attack. The fluorine gas however, still reacts with the chamber internal parts such as chamber walls and electrodes; thus consuming fluorine and generating metal fluoride contaminants. Metal fluoride dust is trapped by means of an electrostatic precipitator not shown. A small amount of laser gas is extracted from the chamber and is passed over negatively charged high field wires to trap the dust. The dust-free gas is then released over the windows to keep them clean.

Pulse Power Module

Figure 4:
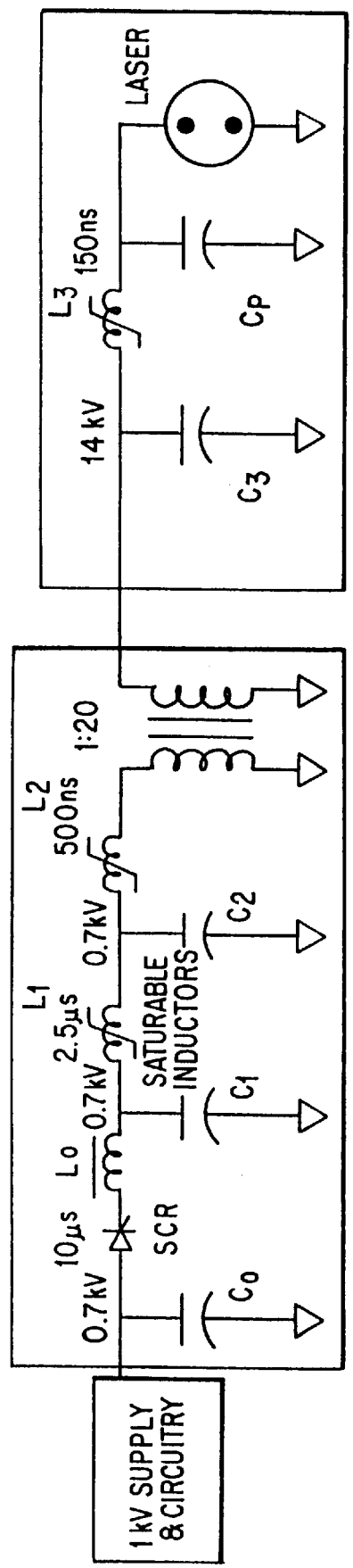
FIG. 4 is a simplified electrical drawing of a solid state pulse power circuit.
Figure 5:
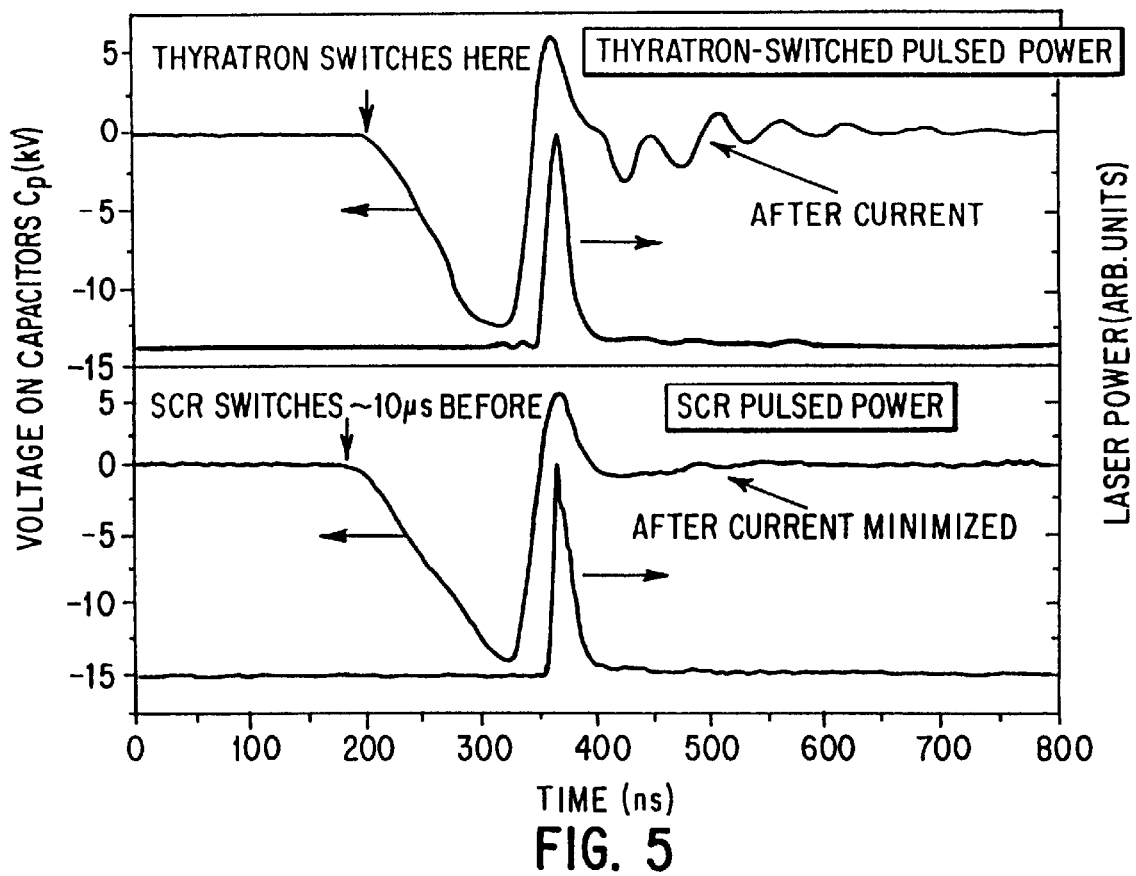
FIG. 5 are graphs comparing the results of a solid state pulse power circuit to a prior art thyratron-based circuit.
Figure 6:
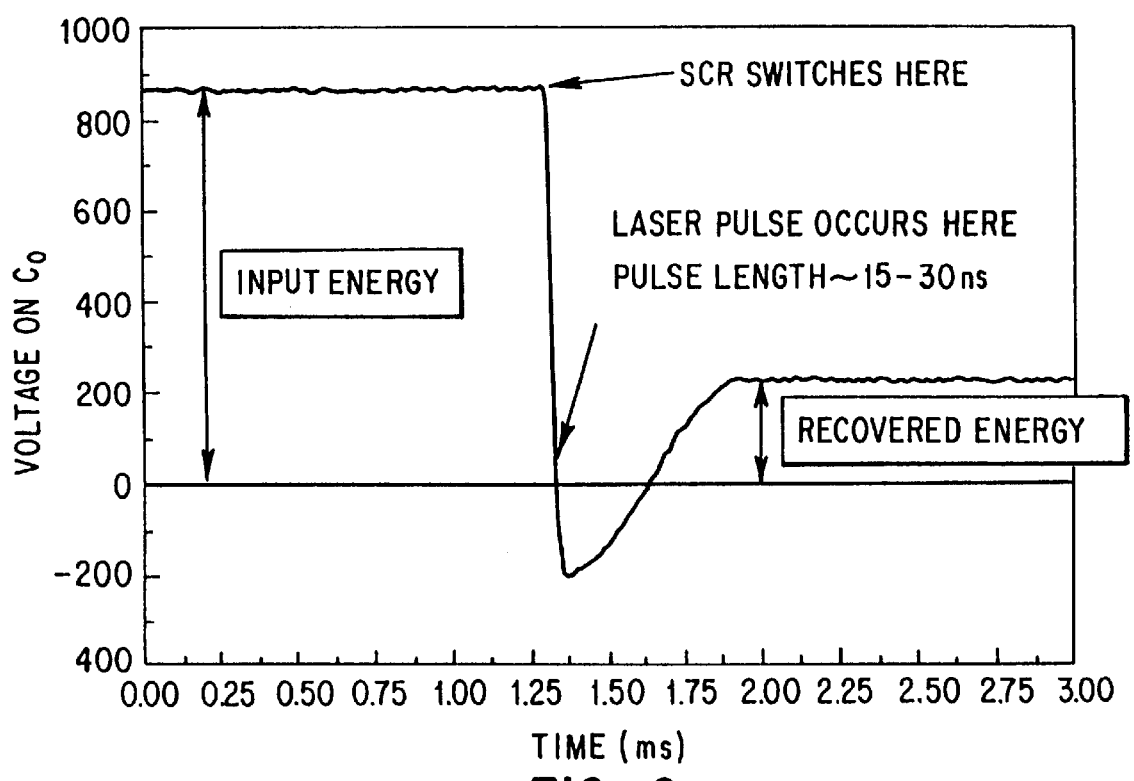
FIG. 6 is a graph of operating voltage during a pulse.

This preferred embodiment utilizes a solid state pulsed power module (SSPPM) circuit shown in FIG. 4. The 20 kV power supply of prior art thyratron systems is replaced by a 1 kV supply. The thyratron switch is replaced by an SCR switch that does not feed $C_p$ directly, but instead switches the energy of $C_0$ into a pulse compression circuit formed by $C_1$, $C_2$, $C_3$, a step-up transformer, and three saturable inductors. The operation of this circuit is as follows. The DC charge stored on $C_0$ is switched through the SCR and the inductor $L_0$ into $C_1$. The saturable inductor, $L_1$, holds off the voltage on $C_1$ for approximately 2.5 $\mu$s and then becomes conducting, allowing the transfer of charge from $C_1$ to $C_2$. The second saturable inductor, $L_2$, holds off the voltage on $C_2$ for approximately 500 ns and then allows the charge on $C_2$ to flow through the primary of 1:20 step-up transformer. The output from the step-up transformer is stored on $C_3$ until the saturable inductor $L_3$ becomes conducting in approximately 100–150 ns. The charge is then finally transferred through $L_3$ into $C_p$ and laser discharge occurs. The voltage waveform on $C_p$, shown at the bottom of FIG. 5 closely matches the shape of that produced by an equivalent thyrtaron-switched pulsed power module, except that the SRC waveform exhibits little or no after-ringing. The increased complexity of the SSPPM is compensated for by the elimination of the expensive and short-lived thyratron. The improvement in pulse control is shown in FIG. 5. An additional and important feature of the SSPPM is the recovery of the energy reflected from the laser chamber as shown in FIG. 6. With the SSPPM, the energy reflected by the laser chamber due to impedance mismatch no longer rings back and forth between the SSPPM and the laser chamber. The SSPPM circuit is designed to transmit this reflected energy all the way back through the pulse forming network into $C_0$. Upon recovery of this energy onto $C_0$, the SCR switches off ensuring that this captured energy remains on $C_0$. Thus, regardless of the operating voltage, gas mixture, or chamber conditions, the voltage waveform across the laser electrodes exhibits the behavior of a well-tuned system. This performance is maintained over all laser operating conditions.

Spectral Narrowing

Spectral narrowing of a KrF laser is complicated by its short pulse duration (10 to 15 ns, FWHM) and UV wavelength. The short pulse results in very high intra-cavity power (~1 MW/cm$^2$), and the short wavelength can thermally distort optical materials due to their high absorption co-efficient at 248 nm. Also, the total number of round trips through the resonator (which includes the line narrowing optical elements) for a typical laser is small, about 3 to 4. If the single pass line width through the resonator is denoted by $\Delta\lambda_1$, then an estimate of the final line width $\Delta\lambda_f$ after n passes is given by:

$$\Delta\lambda_f = \frac{\Delta\lambda_1}{\sqrt{n}} \quad (1)$$

Therefore, the single pass line width of the optical system is, at most, a factor of two higher than the final line width. Therefore, the efficiency of converting the broadband spectrum to line narrowed spectrum (i.e. from 300 pm to <1 pm) of the optical system must be very high.

Resonance Cavity

In this embodiment, we use a 20 percent partially reflecting convex cylindrical mirror 68 as shown in FIG. 3. The opposite side of the resonance cavity is the line narrowing module as shown in FIG. 3. The module 18 is shown is detail in FIG. 7.

Figure 7:
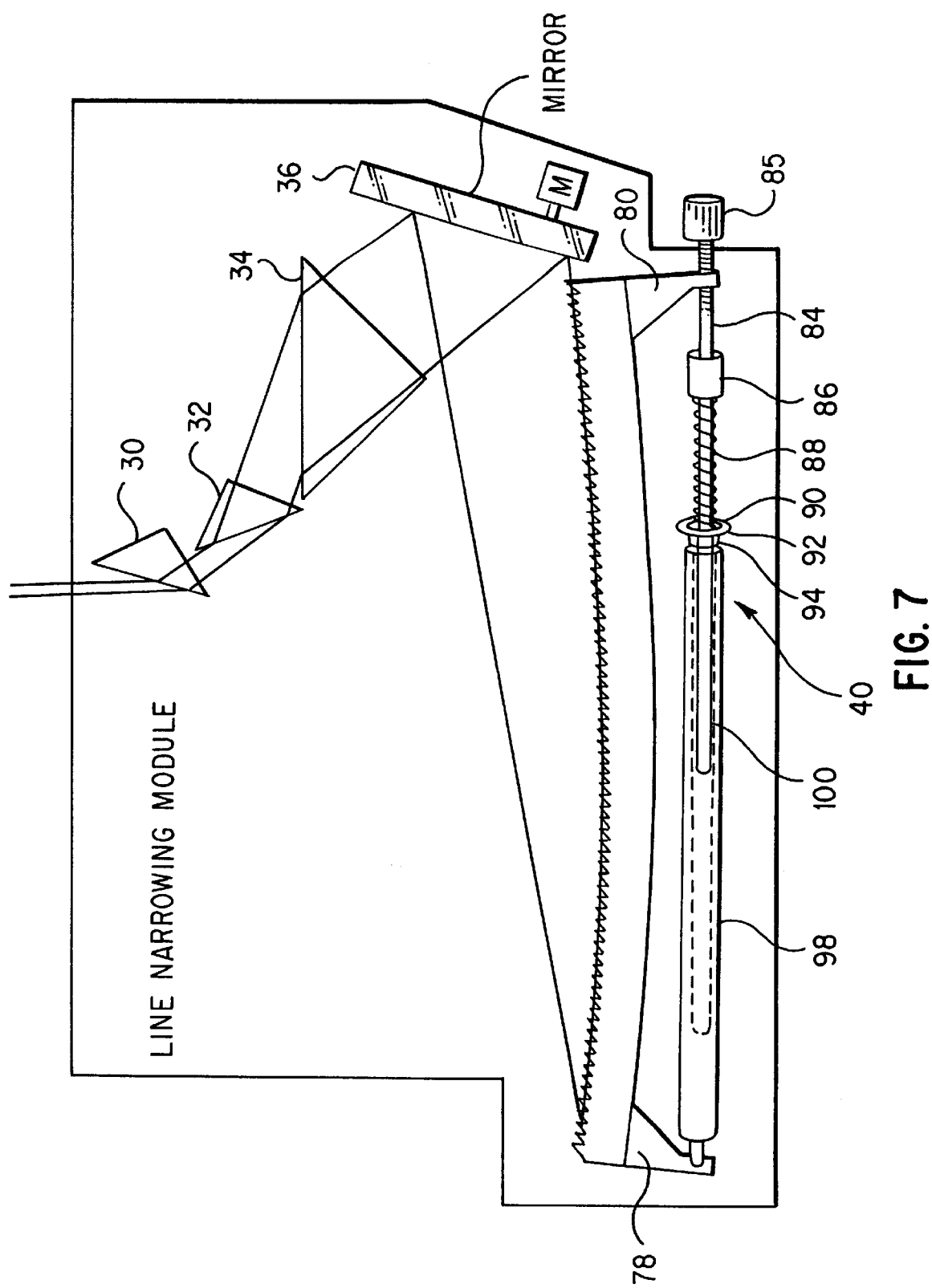
FIG. 7 is a sketch of the principal elements of a line narrowing module with a grating having adjustable curvature.

Three prisms beam expanders 30, 32 and 34 as shown in FIG. 7 are inserted in the line narrowing module in order to expand the beam in the horizonal direction by a factor of about 20 and thus reduce its divergence in that direction. Two apertures at both ends of the laser are used to further reduce divergence. The expanded beam is reflected off totally reflecting mirror 36 onto grating 38 which is curved to produce a cylindrical concave grating surface as shown in FIG. 7 by bending mechanism 40. Grating 38 is typically made of a low expansion glass such as ULE glass marketed by Corning, Inc. Two legs 78 and 80 are cemented to the grating 38. Bending mechanism 40 is used to apply compressive forces to the inner side of legs 78 and 80 to provide a cylindrical concave curve to the grating surface of grating 38. Threaded push bolt 84 is rotated in corresponding threads in leg 80 to displace cylindrical fitting 86 against spring 88, compressing spring 88 against washer 90, bearing 92, washer 94, push rod housing 98, and leg 78. Cylindrical fitting 86 is mounted on push rod 100. Spring 88, washers 90 and 94, bearing 92, and push rod housing 98, slide on push rod 100. Thus, the compressive force in spring 88 resulting from rotating head 85 of push bolt 84 is applied to the inside of legs 80 and 78 spreading them slightly to force the grating surface of grating 38 into a cylindrical concave shape. The curvature preferably is very slight. For example, to correct for the wavefront distortion imposed by cylindrical mirror 68 having a surface convex curvature corresponding to a radius of 5 meters, the compensating concave curvature of grating 38 needs to be a curvature which will produce a focal point located at a distance of about 1400 meters from the grating. Our experiments have shown that the proper curvature can be provided with a few pounds of compressive force applied to the inside of legs 78 and 80. This much reduced curvature of the grating, as compared to the output coupler, results from the magnification of the prism beam expander arrangement of this embodiment. The adjustment provided by this mechanism can also be used to compensate for distortion other than that provided by the output coupler, such as unintended distortions caused by heating of the prisms. (The grating curvature is greatly exaggerated in FIG. 7.) In applications where distortions could be time dependent, motor control could be added to rotate threaded push bolt 84 and real time feedback control could be provided to minimize this time dependent variable distortion.

Experimental Results

Figure 1:
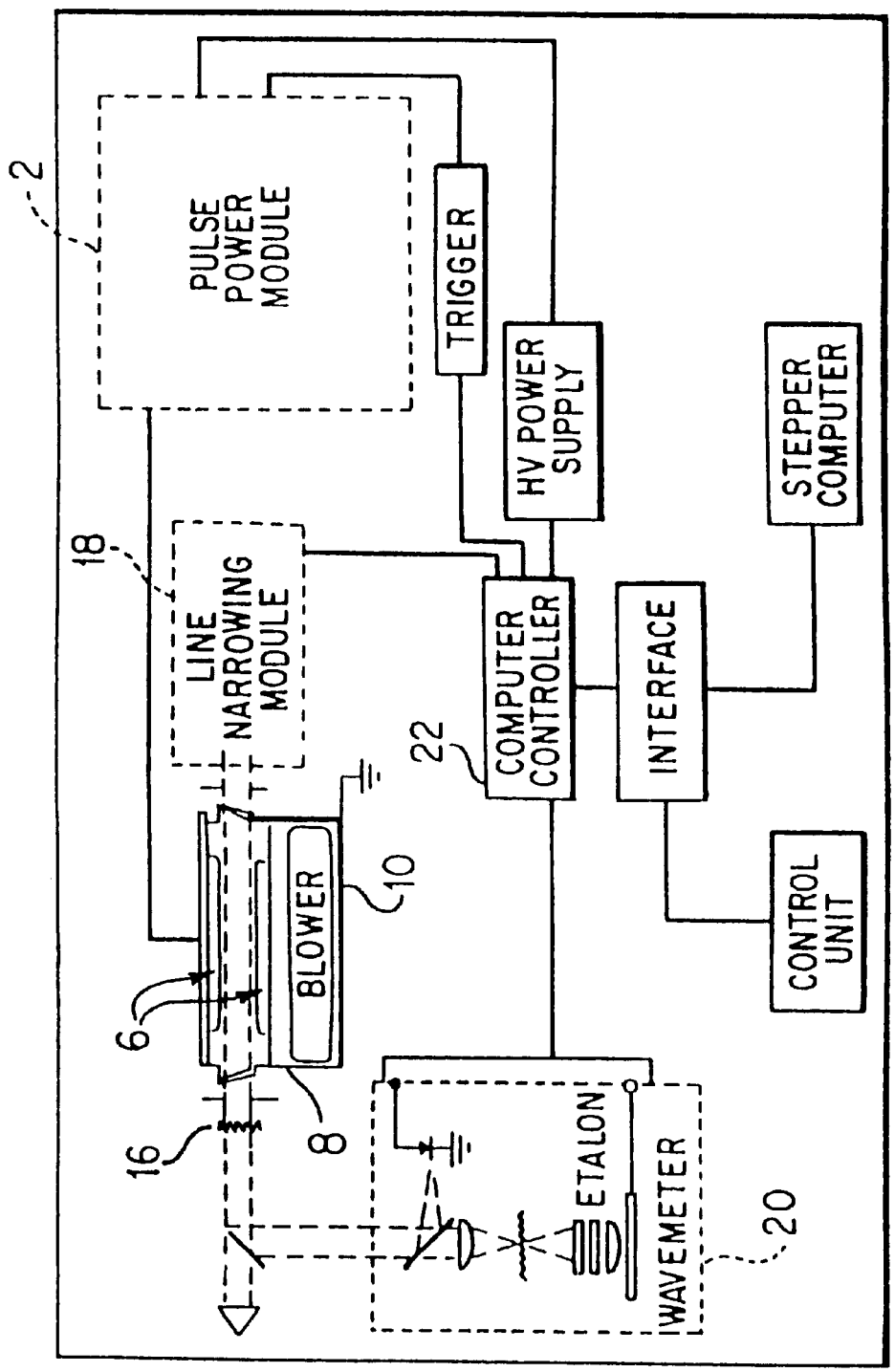
FIG. 1 is a block drawing showing the principal elements of a prior art commercal KrF excimer lasers used for integrated circuit lithography.
Figure 2:
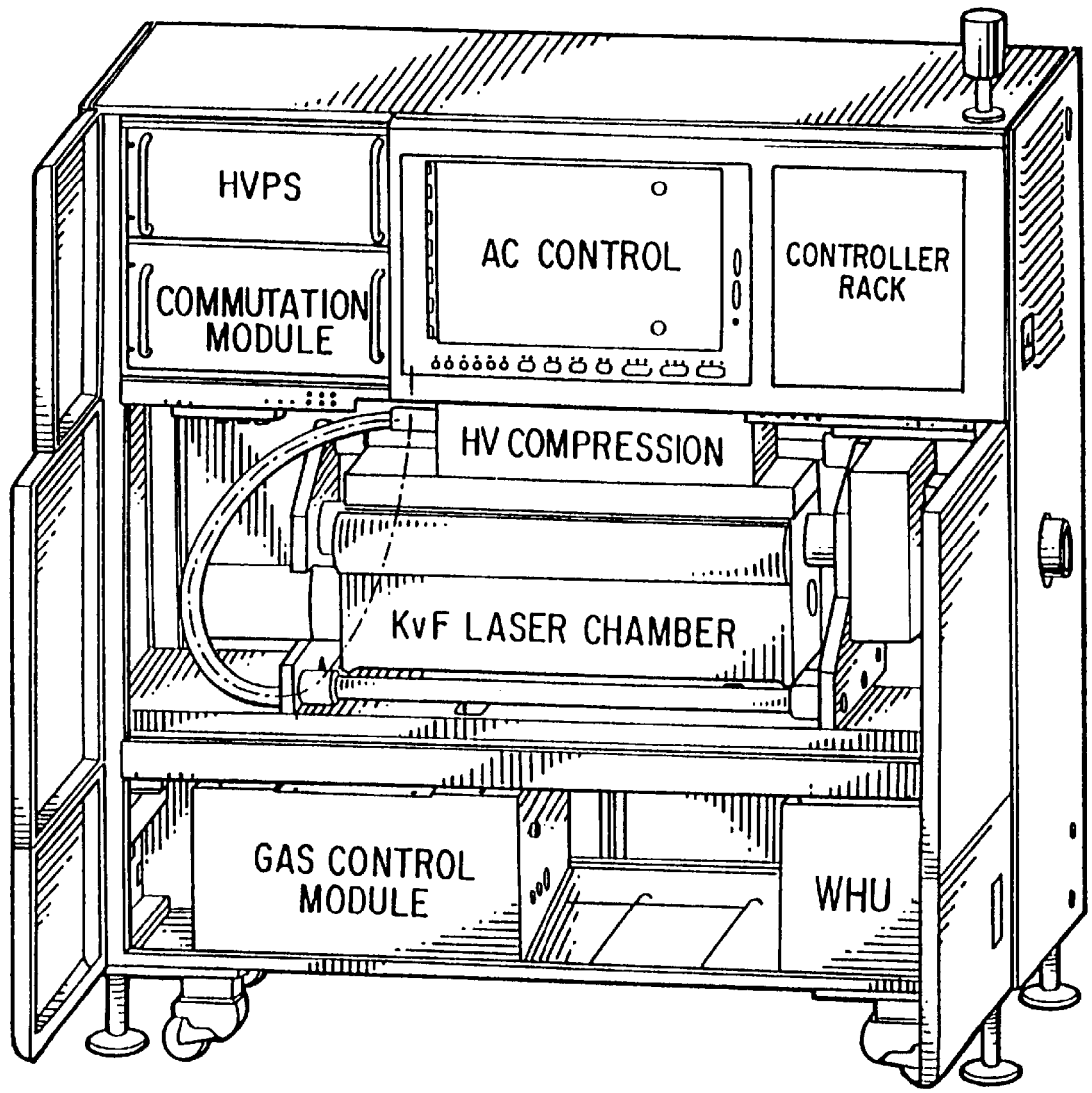
FIG. 2 is a schematic drawing of the above prior art KrF laser.
Figure 9:
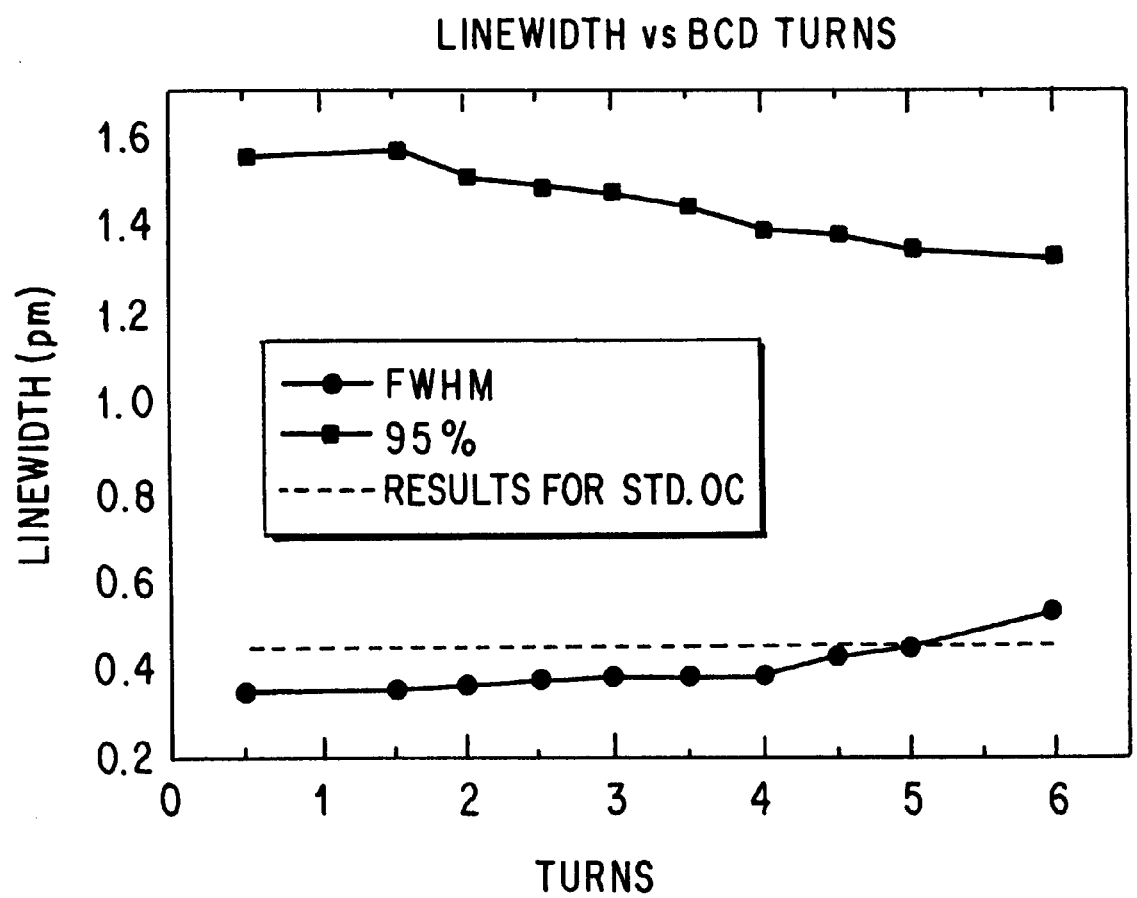
FIGS. 9 through 11 are graphs of test data demonstrating the results of test on a prototype embodiment of the present invention.

All experiments described below have been done with a Cymer Model ELS5400 laser as shown in FIGS. 1 and 2 with the modification shown in FIG. 3. The output coupler 68 used was a convex cylindrical mirror (radius curvature r=5 m). The convex surface of the mirror was coated for R=20% reflection and the plane surface was AR coated. As shown in FIG. 7, diffraction grating 38 is bent to form a cylindrical concave grating surface in order to compensate for the laser light wavefront distortion caused by cylindrical mirror 68. This adjustment is made by turning threaded push rod head 85 to apply compressive force at legs 78 and 80. Zero turns is arbitrary and for these experiments corresponded to the first indication that turning of bolt 84 was beginning to affect the output beam. In a sense, this system is similar to a standard telescopic cavity. The major difference is that in our case the diffraction grating is used as a curved back mirror and a line narrowing element simultaneously. Also in our case, we have a cylindrical telescopic cavity as compared to spherical telescopic cavity, so we only have "telescopic" properties in one dimension, i.e., horizontal. The laser used for the test comprised line narrowing module with fused silica prisms which had an operating history of 0.3 billion pulses. The chamber used for the tests had been previously used for 0.9 billion pulses. FIG. 9 shows the dependence of $\lambda_{FWHM}$ and $\lambda_{95\%}$ adjustment. The gas mixture was 0.28 kPa F2 (about 3.9 kPa Kr, with the rest of the gas being buffer gas Neon, for a total gas pressure of 290 kPa). Laser was running at 1000 Hz repetition rate in 50 pulse bursts with 0.2 s between the bursts. One can see that $\lambda_{FWHM}$ is about 0.35 pm at ½ turns of bolt head 85, stays below 0.4 pm up to 4 turns, and then start to group up. The 95% integral ($\lambda_{95\%}$) on the other side, is the highest at ½ turn and gradually decreases up to 6 turns. The dotted line in FIG. 9 shows the best results obtained on the same laser using standard output coupler of the prior art.

The reader should note that partially reflecting mirror 65 functions as a lens with respect to the portion of the beam passing through it. This effect should be considered in each application. The back side of the mirror preferably is either concave or plano. In the later case, the output coupler will work as a slightly focusing lens for the outcoming beam. Therefore, appropriate optics well known in the prior art might be provided to compensate for this focusing effect.

Figure 14:
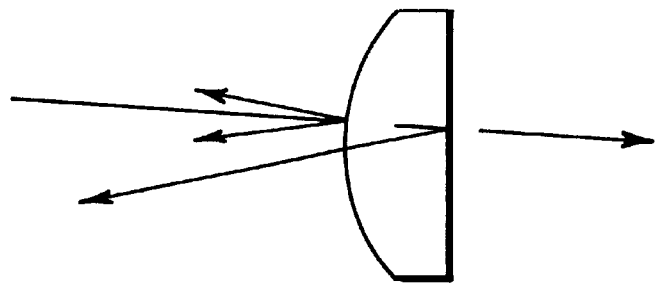
FIG. 14 is a sketch of a preferred output coupler.

Reflection from the back side of output coupler 65 should be taken into consideration and dealt with using well known prior art techniques such as anti reflection coatings and angling the back surface or positioning the partially reflecting mirror off-axis and at a compensating angle (as shown in FIG. 14) so that any reflection from the back side that does result is directed out of the active lasing medium.

An important feature of the present invention is that the unstable resonance cavity utilizing the partially reflecting mirror produces better beam width control over the lifetime of the laser. This is because the photons originating at the edges of the gain medium tend to be pushed out of the gain medium whereas photons originating near the central axis of the gain medium remain in the resonance cavity and receive greater amplification.

The preferred embodiment described above uses in the output coupler a partially reflecting mirror that uniformly reflects 20%. A variation would be to grade the reflection so that the reflection is greater at the center of the cylindrical mirror and decreases toward the edge. For example, a possible design would be to provide for about 30 percent reflection at the center with gradual reduction in reflection to less than 1% at the two edges of the mirror.

Figure 10:
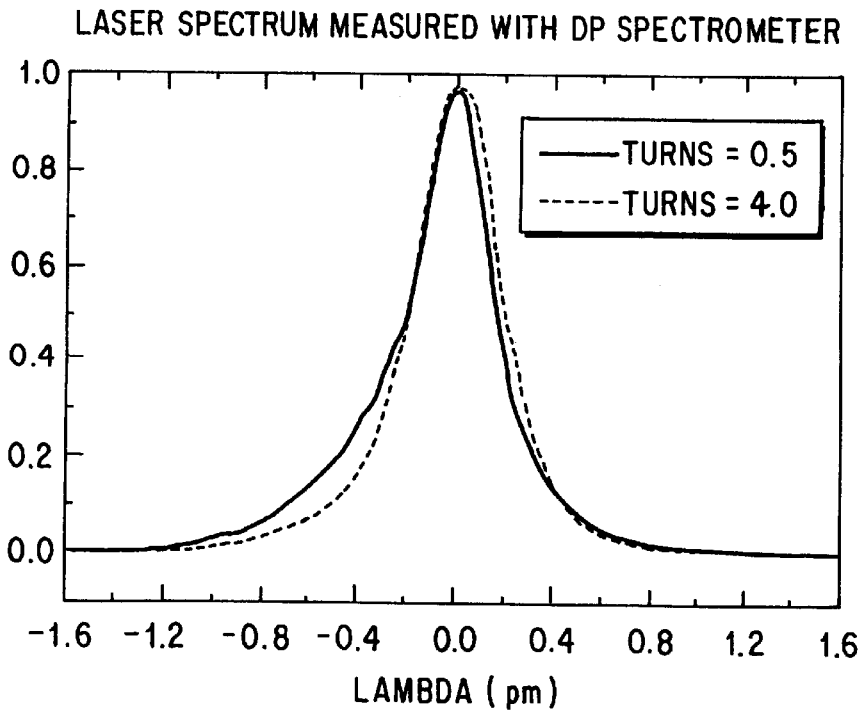

Changes in the spectra can be seen in FIG. 10 which shows the spectra for ½ turn and 4 turns of the head 85. At ½ turn, we have a short wavelength tale in the spectrum which increases $\lambda_{95\%}$ value. At 4 turns, the spectrum is more symmetrical mainly because of reduction of that tale and reduction of $\lambda_{95\%}$ accordingly.

Figure 11:
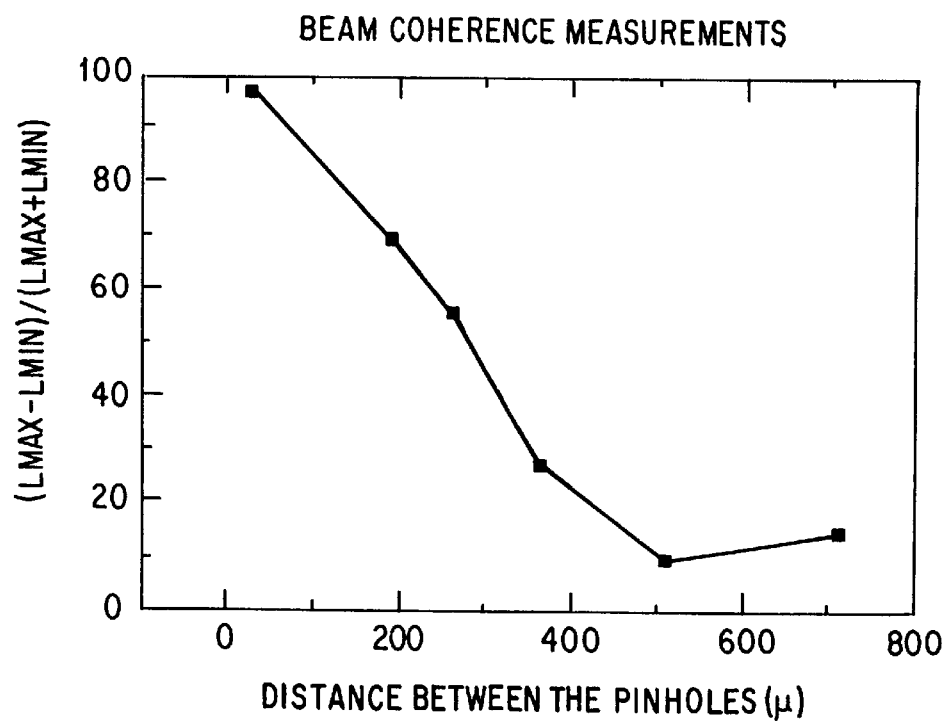

One of the major concerns is spatial coherence of the laser. The coherence of lithography laser beams is normally desired to be small to avoid speckle structure during exposure of the photoresist. FIG. 11 shows the results on spatial coherence measured with double-pinhole technique. In this technique, we measure the modulation depth of the interference fringes created by passing the beam through two pinholes separated by known distance. That modulation depth gives us information on the spatial coherence of the beam. One can see that the fringe modulation drops by one-half at approximately 300$\mu$, which is very close to standard ELS5000 laser performance and is acceptable for the stepper.

Preferred Wavelength Control Technique

The preferred control technique for achieving minimum line width is to use computer 22 as shown in FIG. 3 to control tunable line narrowing module 18 based on real time wavelength measurements obtained from wavemeter 20. This is accomplished preferably by fine adjustment of the position of mirror 36 which changes the angle at which the laser beam illuminates grating 38.

Wavelength and Bandwidth Measurement

The center wavelength of the lithography laser output radiation has to be stabilized in order to: a) maintain focus at the wafer plane, and b) minimize any change in magnification. The wavemeter used for a production lithography laser preferably is compact and yet meets the requirements of good relative accuracy, small long term drift, and a good absolute precision with a reference to an atomic line. Further, the wavelength measurement should be insensitive to changes in the ambient temperature or pressure. In addition, the wavemeter should be capable of measuring the spectral bandwidth (FWHM) with an accuracy of ±0.15 pm. The operating range of this wavemeter can be relatively small, 248.35±0.30 nm.

Figure 8:
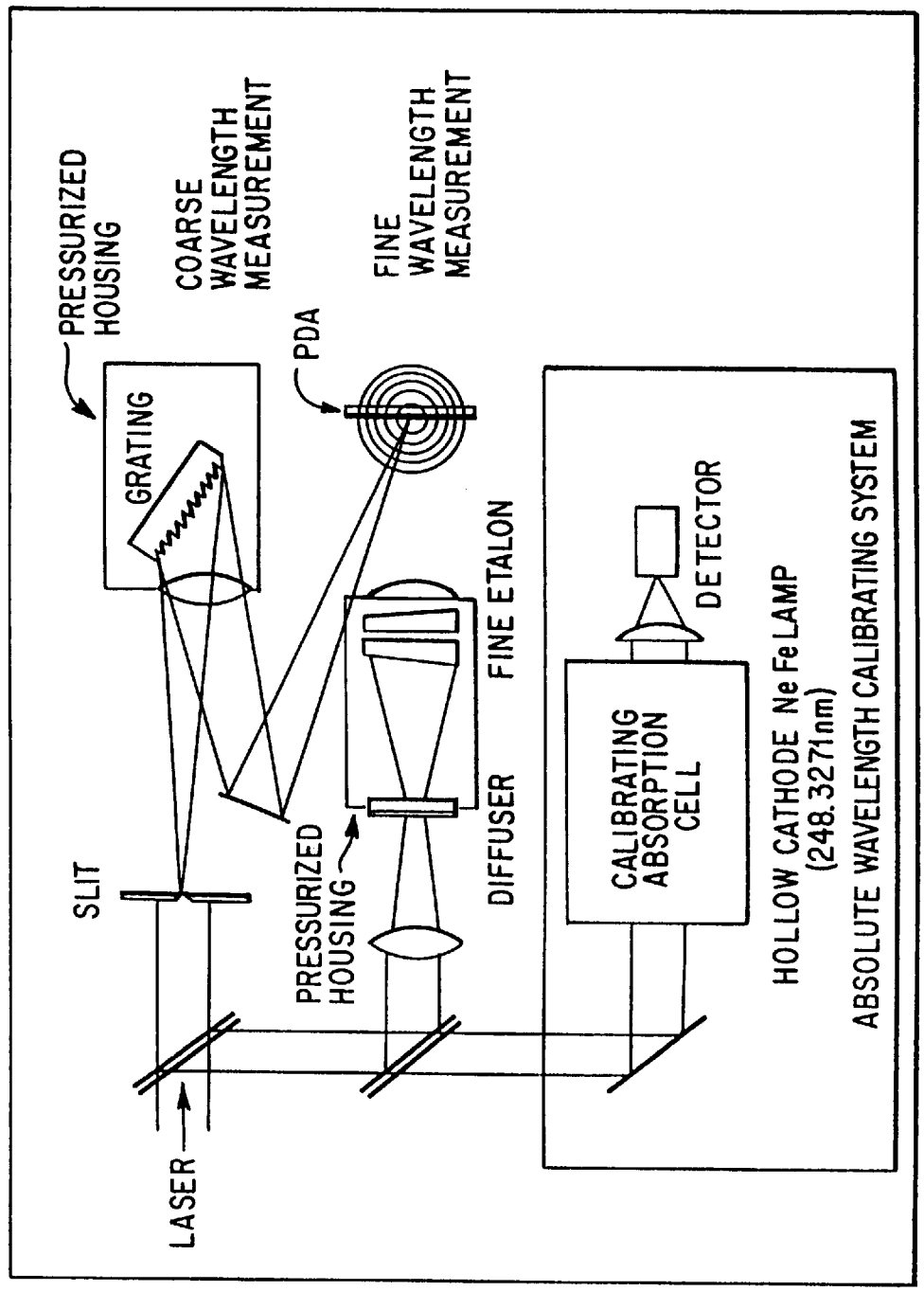
FIG. 8 shows how the wavelength of the laser output beam is measured.

The wavelength is measured using a combination of a grating and an etalon. A schematic layout of this wavemeter is shown in FIG. 8. The grating and the etalons are used respectively for coarse and fine measurements. The output from the grating spectrometer is imaged in the central region of a 1024 element silicon photo diode array, while the fringe pattern from the etalon is imaged on the two sides. The wavelength is determined by measuring the diameter of the etalon fringe pattern and the position of the coarse grating output.

A small change in fringe diameter is proportional to change in the wavelength. For wavelength change less than the free spectral range (FSR) of the etal on, the etalon is capable of tracking the wavelength of the laser. The coarse grating measurement is necessary to eliminate any possible error or discrepancy in the laser wavelength drift of greater than the FSR of the etalon. The preferred etalon has an FSR of 10 pm or less; or another alternative would be to use two etalons, one with an FSR of 20 pm, and the other with an FSR of 5 pm. As is well known, the etalon fringe pattern is identical for wavelengths separated by multiples of its FSR.

The wavemeter is calibrated at the factory with reference to a hollow cathode Ne-Fe lamp which has an absorption peak at 248.3271 nm. Experience has shown that these wave meters can be made stable to within ±0.5 pm. Furthermore, to eliminate ambient pressure dependent changes, both the grating and the etalon are housed inside individual pressurized housings. Temperature stability is achieved by using very low thermal expansion coefficient etalon spacers and good thermal management of the etalon housing.

Finally, the wavelength information obtained from the Wavemeter is used to control laser wavelength by changing the angle of illumination on the grating in the line narrowing module. This is done by very slightly pivoting mirror 36 shown in FIG. 7.

Other Embodiments

As suggested above, output coupler 68 could be a partially reflecting concave mirror. In this case, the grating preferably is curved to provide a compensating convex cylindrical reflecting surface. This is done preferably by modifying the adjustment mechanism shown in FIG. 7 to provide for an adjustable tension force pulling legs 78 and 80 inwardly. When a concave mirror is used for the output coupler, the laser output will be diverging so that an additional appropriate optical component may be required to reduce the divergence.

The surface curvature of grating 38 can be adjusted in other obvious ways such as in the manner described in U.S. Pat. No. 5,095,492 where the two back edges of the grating are blocked and the center portion is pulled backward to provide a cylindrical concave surface.

Although this very narrow band laser has been described with reference to a particular embodiment, it is to be appreciated that various adaptations and modifications may be made. For example, the techniques described for use on a KrF laser which operates at a nominal wavelength can also be applied to ArF lasers; however, the optics must be designed for 193 nm. In addition, the hand adjustment of compression rod 35 could be motor driven with feedback control so that grating curvature could be modified based on real time measurements of wavelength and other beam parameters. Therefore, the invention is only to be limited by the appended claims.

That which is claimed is:
1. A narrow band laser comprising:
   A. a gain medium,
   B. an unstable resonance cavity comprised of:
      (1) an output coupler comprising a partially reflecting convex cylindrical mirror defining an output coupler curved surface,
      (2) a line narrowing module comprising:
         (a) a beam expander,
         (b) a grating having an adjustable convex curved surface wherein said adjustable curved surface of said grating is adjusted to compensate for wavefront modification caused by said output coupler curved surface.
2. A laser as in claim 1, wherein said cylindrical mirror comprises a reflective coating designed to reflect about 20 percent of light at a desired wavelength.
3. A laser as in claim 1, wherein said cylindrical mirror has a radius of curvature between 1 m and 10 m, preferably 5 m.
4. A laser as in claim 1, wherein said cylindrical mirror defines a center line, and said laser defines an active area of said mirror, and edges of said active area comprises a reflective coating providing substantially greater reflectivity along said center line than other regions of said active area.
5. A laser as in claim 4 wherein two of said edges are parallel to said center line and said reflectivity decreases monotonically from said center line to each of said active edges.

6. A laser as in claim 1, wherein the curved surface of said grating defines a curvature and said line narrowing module further comprises curvature adjustment mechanism for adjusting said curvature.

7. A laser as in claim 6, wherein said adjustment mechanism comprises a spring and a threaded adjustment bolt.

8. A laser as in claim 1 defining a beam axis, wherein said mirror is mounted off-axis and tilted with respect to the beam axis.

9. A laser as in claim 1, wherein said partially reflecting mirror defines a center line and two edges and comprises a reflective coating providing graded reflection which is greater at the center line and reduced near the two edges.

10. A very narrow band excimer laser comprising:
A. a laser chamber containing:
(1) two elongated electrodes,
(2) at least one preionizer, and
(3) a laser gas;
B. an output coupler comprising a convex cylindrical mirror;
C. a line-narrowing unit comprising a grating having a cylindrical concave lined surface;
said grating and said output coupler defining an unstable resonance cavity; and
said lined surface of said grating is curved to compensate for wavefront modification produced by said output coupler.

11. An excimer laser as in claim 10 wherein said line narrowing unit further comprises:
(A) at least one beam expanding prism; and
(B) a grating tuning means for tuning the grating.

12. An excimer laser as in claim 11 and further comprising a wavemeter and a wavelength controller for controlling the grating tuning means.

13. An excimer laser as in claim 10 wherein said line narrowing unit further comprises at least one prism and a totally reflecting mirror.

14. An excimer laser in claim 10 wherein said laser gas is comprised of fluorine and krypton.

15. A very narrow band excimer laser comprising:
A. a laser chamber containing:
(1) two elongated electrodes
(2) at least one preionizer, and
(3) laser gas comprised of fluorine, a halogen and a buffer gas;
B. a tunable line narrowing unit comprised of:
(1) at least one beam expanding prism;
(2) a tunable concave grating;
C. an output coupler comprising a convex cylindrical mirror, said tunable grating and said cylindrical mirror defining an unstable resonance cavity wherein said tunable concave grating is tuned to compensate for wavefront modification produced by said output coupler.

16. An excimer laser as in claim 15 and further comprising a wavemeter for measuring wavelength of said output laser beam.

17. An laser a in claim 15 and further comprising a controller for tuning the line narrowing unit.

* * * * *